United States Patent [19]

Ng et al.

[11] Patent Number: 5,369,045
[45] Date of Patent: Nov. 29, 1994

[54] METHOD FOR FORMING A SELF-ALIGNED LATERAL DMOS TRANSISTOR

[75] Inventors: Wia T. Ng, Thornhill, Canada; Oh-Kyong Kwon, Seoul, Rep. of Korea

[73] Assignee: Texas Instruments Incorporated, Dallas, Tex.

[21] Appl. No.: 86,773

[22] Filed: Jul. 1, 1993

[51] Int. Cl.$^5$ .......................................... H01L 21/265
[52] U.S. Cl. ...................................... 437/41; 437/45; 437/44; 148/DIG. 126
[58] Field of Search .................. 437/40, 41, 43–45, 437/59, 909, 29, 69; 148/DIG. 126; 257/141, 401, 328, 336

[56] References Cited

U.S. PATENT DOCUMENTS

| | | | |
|---|---|---|---|
| 4,757,032 | 7/1988 | Contiero | 437/162 |
| 4,798,810 | 1/1989 | Blanchard et al. | 437/29 |
| 4,810,665 | 3/1989 | Chang et al. | 437/30 |
| 4,879,254 | 11/1989 | Tsuzuki et al. | 437/41 |
| 4,883,767 | 11/1989 | Gray et al. | 437/41 |
| 4,890,142 | 12/1989 | Tonnel et al. | 357/23.4 |
| 4,902,636 | 2/1990 | Akiyama et al. | 437/45 |
| 4,904,614 | 2/1990 | Fisher et al. | 437/41 |
| 4,922,327 | 5/1990 | Mena et al. | 357/23.4 |
| 5,032,532 | 7/1991 | Mori et al. | 437/41 |
| 5,059,547 | 10/1991 | Shirai | 437/40 |
| 5,068,700 | 11/1991 | Yamaguchi et al. | 357/23.8 |
| 5,237,193 | 8/1993 | Williams et al. | 257/336 |
| 5,248,627 | 9/1993 | Williams | 437/45 |

*Primary Examiner*—George Fourson
*Assistant Examiner*—David M. Mason
*Attorney, Agent, or Firm*—Ira S. Matsil; James C. Kesterson; Richard L. Donaldson

[57] ABSTRACT

A method of forming a LDMOS transistor device 10 is disclosed herein. A semiconductor layer 14 is provided. The layer 14 may be an n-type RESURF region formed over a p-substrate 12. An insulating layer 24, such as a field oxide, is formed on the semiconductor layer 14. The insulating layer 24 is then patterned to expose source and drain windows. A D-well region 20 is then formed within the source window portion of the semiconductor layer. A sidewall region is formed adjacent a sidewall of the insulating layer around the source window. The source and drain regions 16 and 18 are then formed, for example by implanting arsenic or phosphorus ions. A gate electrode 26 is formed over a portion of the D-well region 20 between the source region 16 and the insulating layer 24. The gate electrode 26 is formed over a channel region within the D-well 20 between the source 16 and drain 18.

20 Claims, 3 Drawing Sheets

5,369,045

METHOD FOR FORMING A SELF-ALIGNED LATERAL DMOS TRANSISTOR

CROSS-REFERENCE TO RELATED APPLICATIONS

The following coassigned patent applications is hereby incorporated herein by reference:

| Serial No. | Filing Date |
| --- | --- |
| 08/031,731 | March 15, 1993 |

FIELD OF THE INVENTION

This invention generally relates to the fabrication of semiconductor devices and specifically to a self-aligned lateral DMOS transistor.

BACKGROUND OF THE INVENTION

Future intelligent power ICs will require high-density power devices along with analog functions and VLSI logic. DMOS transistors are important in power device applications capable of handling high voltages. For such devices, one figure of merit is the current handling capability per unit area or the ON resistance per unit area. For a given voltage rating, the ON resistance per unit area may be reduced by reducing the cell area of the DMOS device.

In the field of power transistors, the combined width of the polycrystalline silicon (polysilicon) and the contact region, which forms the gate and source electrodes, respectively, is defined as the cell pitch of the device. For a DMOS power transistor, a known technique to reduce the width of the polysilicon region is by decreasing the P-well junction depth. However, minimum junction depth is dictated by the breakdown voltage required.

A conventional structure Lateral DMOS (LDMOS) device is well suited for incorporation into VLSI processes because of its simplicity. However, LDMOS devices have been considered inferior to Vertical DMOS (VDMOS) devices, and therefore have not received significant attention. Recently, a RESURF (REduced SURface Field) LDMOS device with good specific on-resistance ($R_{sp}$) has been demonstrated. But that device structure is more complex and not very versatile, being limited to grounded source applications.

SUMMARY OF THE INVENTION

Sixty volt lateral DMOS (Double diffused metal oxide semiconductor) transistors generally require very narrow cell pitches in order to obtain optimal specific on-resistance performance. However, alignment tolerance can cause LDMOS transistor strips to have slightly different device dimensions leading to different specific on-resistance and breakdown voltage. This problem is quite pronounced for devices with cell pitch in the order of only a few microns. Local hot spots and premature breakdown could occur during transient. This patent describes a self-aligned symmetric LDMOST process that can maintain symmetry between adjacent transistor strips and eliminates the forementioned problem.

Other objects and advantages will be obvious, and will in part appear hereinafter and will be accomplished by the present invention which provides a method and apparatus for to a self-aligned lateral DMOS transistor.

A method of forming a LDMOS transistor device is disclosed herein. A semiconductor layer is provided. This layer may be an n-type RESURF region formed over a p-substrate. An insulating layer, such as a field oxide, is formed on the semiconductor layer. This insulating layer is then patterned to expose source and drain windows. A D-well region is then formed within the source window portion of the semiconductor layer. A sidewall region is formed adjacent a sidewall of the insulating layer around the source window. The source and drain regions are then formed, for example by implanting arsenic or phosphorus ions. A gate electrode is formed over a portion of the D-well region between the source region and the insulating layer. The gate electrode is formed over a channel region within the D-well between the source and drain regions.

BRIEF DESCRIPTION OF THE DRAWINGS

The above features of the present invention will be more clearly understood from consideration of the following descriptions in connection with accompanying drawings in which.

FIG. I is cross sectional view of a preferred embodiment LDMOS transistor; and

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the structure and fabrication method of the present invention. The preferred embodiment structure will be described first along with a description of modifications. A preferred method of forming the structure will then be described.

Figure 1:
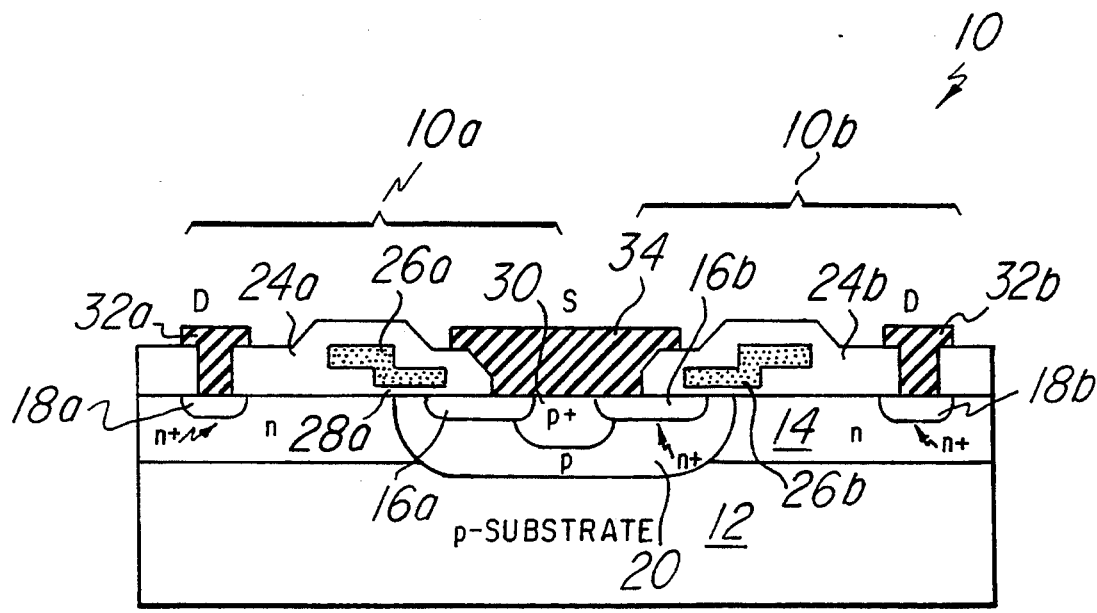

Referring first to FIG. 1, a preferred embodiment transistor device 10 is illustrated. The device 10 actually includes two lateral double diffused metal oxide semiconductor (LDMOS) transistors 10a and 10b. For the following description, only one of the transistors 10a or 10b will be referred although the discussion will refer to each.

The transistor device is formed on a semiconductor substrate 12 which preferably comprises single crystalline silicon. However, polycrystalline layers 12 can also be used as well as other semiconductor materials. A semiconductor layer 14 is illustrated overlying substrate 12. The semiconductor layer 14 may comprise an epitaxially grown layer 14 formed over substrate 12 or a well (or tub) region 14 formed in substrate 12 (or combinations of both). In the preferred embodiment, the layer 14 comprises an n-type RESURFed (REduced SURface Field) drift region formed on a p-type substrate. Alternatively, the layer 14 can be omitted and the transistor device formed directly in the substrate 12. In yet another embodiment, the substrate 12 itself may be a semiconductor layer formed over or within a substrate or even over an insulating layer as with SOI (silicon-on-insulator) technologies. Typically, but not necessarily, the layers 12 and 14 comprise opposite conductivity types. For example, as illustrated, the substrate 12 may be a p-doped substrate and the layer 14 an n-doped layer.

The field effect transistor of the present invention comprises a source region 16 and a drain region 18. To simplify the discussion, only an n-channel transistor will be specifically discussed. However, it should be understood that the inventive concepts would apply to both n and p channel devices even though only an n-channel transistor is illustrated.

The n doped source region 16 is formed in a p doped well region 20. The well region 20 is often referred to as a D-well. The D-well region 20 can extend through the layer 14 and into substrate 12 as illustrated, or alternatively, the region 20 can be fully within layer 14.

The drain region 18 is adjacent to the other end of the field insulating region 24. In the preferred embodiment, the field insulating region 24 comprises a field oxide such as thermally grown silicon dioxide, for example.

Although not illustrated, a shallow extension region, also doped with p type impurities, may be included adjacent the p doped D-well region 20. The shallow extension region (not shown) would typically extend from the D-well region 20 to a first end of field insulating region 24. An embodiment which includes shallow extension regions is described in co-pending application Ser. No. 08/031,731.

A gate electrode 26 is formed over the surface of layer 14. In the illustrated embodiment, the gate 26 extends from over a portion of source 16 to over a portion of the field insulating region 24. In the preferred embodiment, the gate electrode comprises doped silicon (usually polycrystalline but possibly amorphous or even monocrystalline). Other conductive materials including metals or silicides can also be used.

The gate 26 is separated from the surface of layer 14 by a gate dielectric 28. The gate dielectric 28 may comprise either an oxide or a nitride or a combination of both (e.g., a stacked NO or ONO layer).

Sidewall insulating regions (not shown) may be formed on the sidewalls of gate electrode 26. The sidewall regions typically comprise an oxide material such as silicon dioxide or a nitride material such as silicon nitride.

A more heavily doped body region 30 is also illustrated in FIG. 1. The body region 30 may be included to allow good contact to D-well region 20. The body region 30 is typically more heavily doped than the D-well region 20.

Source/drain contacts 32a, 32b and 34 are also included in the transistor device. The contacts 32a, 32b and 34 are provided to electrically couple the source/drain regions 16 and 18 to other components in the circuit. The contacts 32a, 32b and 34 are formed from a conductive material, typically a metal such as aluminum, copper or gold. Other materials such as doped polysilicon or a silicide such as titanium silicide or tungsten silicide may also be used.

In the illustrated embodiment, a single contact 34 is used for the source regions 16 of both transistors 10a and 10b. In an alternate embodiment, two separate contacts could be used if it was desirable to couple each of the source regions to a different component in the circuit.

A preferred method for fabricating a transistor device 10 will now be described with reference to FIGS. 2 through 8.

Figure 2:
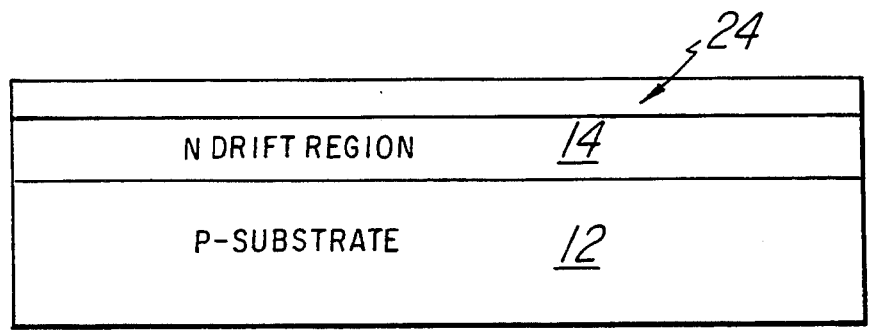
FIGS. 2–8 are cross sectional views of the transistor of FIG. 1 at various stages of device fabrication.

Referring first to FIG. 2, a substrate 12 is provided with a semiconductor layer 14 provided thereon. As previously described, the substrate configuration is not critical to the present invention and may comprise a well region formed in a semiconductor layer, an epitaxially deposited layer or a monocrystalline substrate. In the embodiment illustrated, an n-doped layer 14 is formed over a p-doped substrate 12. In one example, the substrate 12 comprises a p-type, about 10 to 20 Ω-cm substrate on which 7 μm deep n-type well region 14 is diffused.

A field insulating layer 24 is formed over the semiconductor layer 14. The field insulating layer 24 typically comprises an oxide such as silicon dioxide. The field insulating region 24 may be thermally grown or deposited, for example, using a chemical vapor deposition process.

Figure 3:
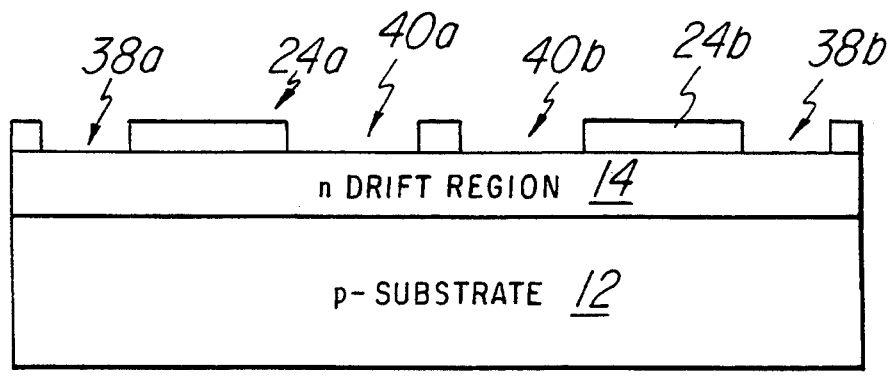

Referring next to FIG. 3, the insulating region 24 is patterned to define the drain and source windows 38 and 40, respectively. In a preferred embodiment, this step is performed using a single mask to ensure identical spacings.

Figure 4:
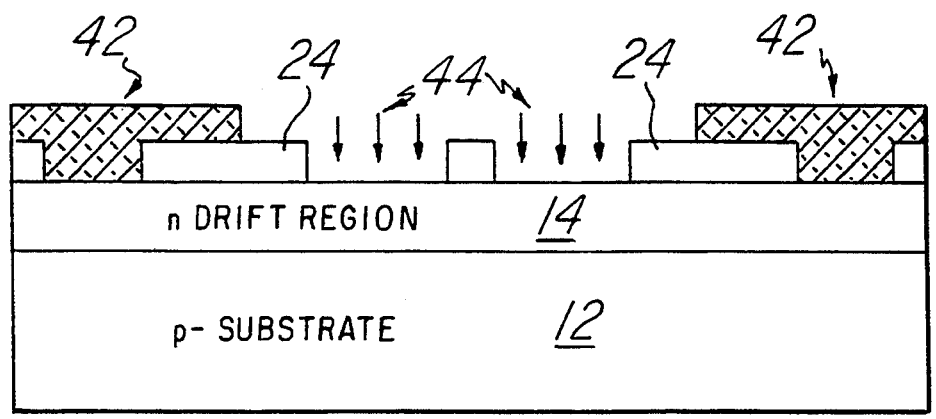
Figure 5:
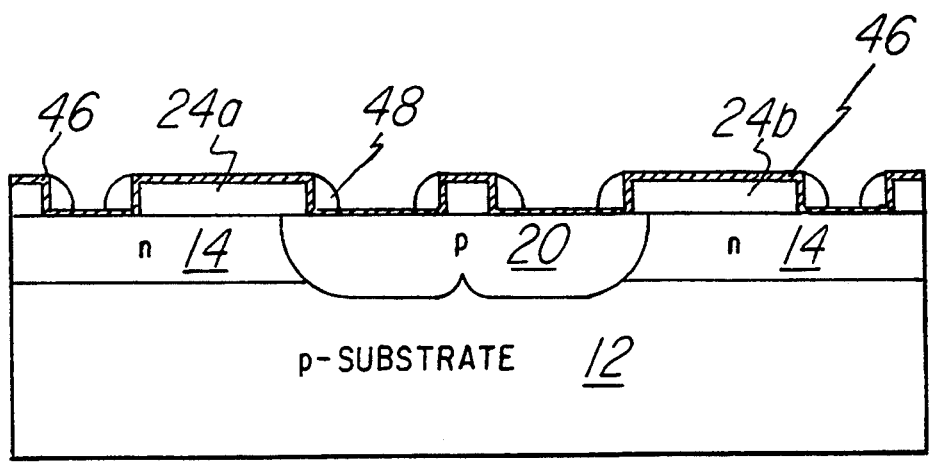

As illustrated in FIG. 4, a masking layer 42 is formed over drain window 38. The masking layer 42 typically comprises photoresist but can be any photolithograph masking layer. Dopant impurities 44 are then implanted into layer 14 to form the D-well 20. Boron is the preferred dopant for a p-type well but other impurities such as aluminum or gallium may also be used. Other doping methods such as diffusion may also be used. High temperature drive-in steps may be used to increase the junction depth of the D-well. The formed D-well 20 is illustrated in FIG. 5.

After D-well 20 is formed, a thin insulating layer 46, preferably a nitride such as $Si_3N_4$ layer is formed. Sidewall insulating regions 46 are then formed on each of the sidewalls of insulating region 24. The sidewall regions 48 are typically an oxide and may be performed using a TEOS (tetraethoxysilane) process. Alternatively, the sidewall regions may comprise a nitride region. The nitride layer 46 serves as an etch mask during formation of oxide sidewall regions 48.

Figure 6:
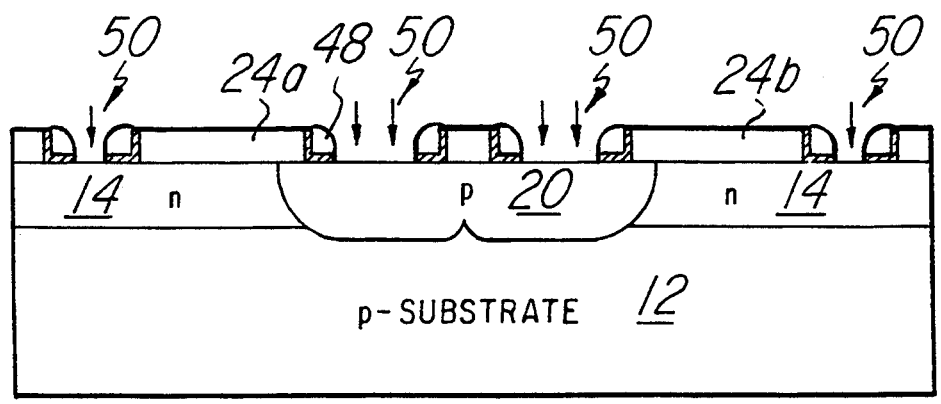

Referring now to FIG. 6, the exposed portions of nitride layer 46 (i.e., the portions not beneath sidewall regions 48) may now be removed.

Figure 7:
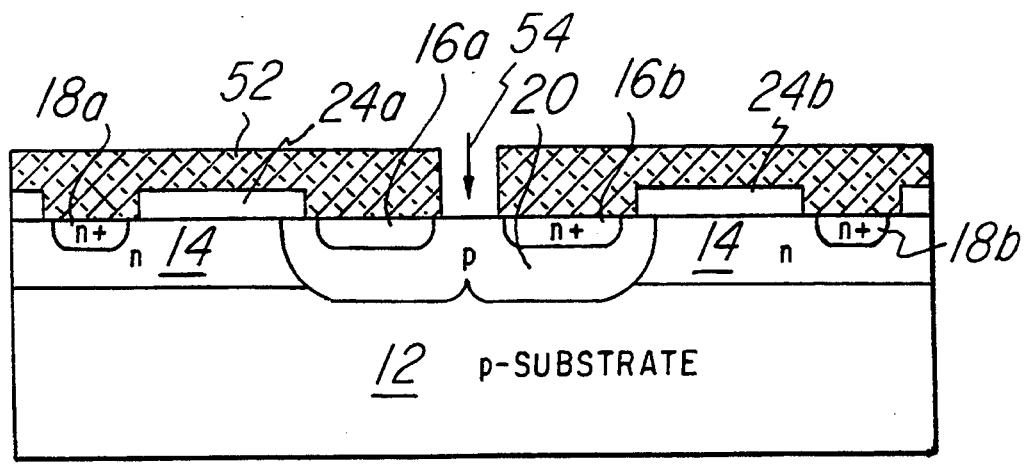

The next step is the formation of source and drain regions 16 and 18. In the preferred embodiment, n-type impurities are implanted as illustrated by the arrows indicated by reference numeral 50. The preferred dopant is arsenic but phosphorus or other dopants such as antimony may also be used. The source and drain regions 16 and 18 are illustrated in FIG. 7.

The sidewall regions 48 which are formed on the thin insulating layer 46 prior to the n+source and drain implant give the device a longer self-aligned MOS channel. Therefore, the long, high temperature drive-in time associated with prior art double diffusion processes can be avoided. This feature allows the present process to be more compatible with existing VLSI technologies.

Referring once again to FIG. 7, the sidewall regions 48 are removed. A masking layer 52 is formed over the device to expose a window for body contact region 30. As illustrated by the arrow indicated by reference numeral 54, body contact impurities are implanted in the D-well 20. In the preferred embodiment, boron ions are implanted but, as previously discussed, other impurities may also be utilized.

Following the p+boron implant, gate dielectric windows (not shown) are defined. The gate dielectric 28 is then formed. The gate dielectric is typically an oxide and is preferably formed by thermal oxidation. Alternatively, the gate oxide 28 may be deposited.

Figure 8:
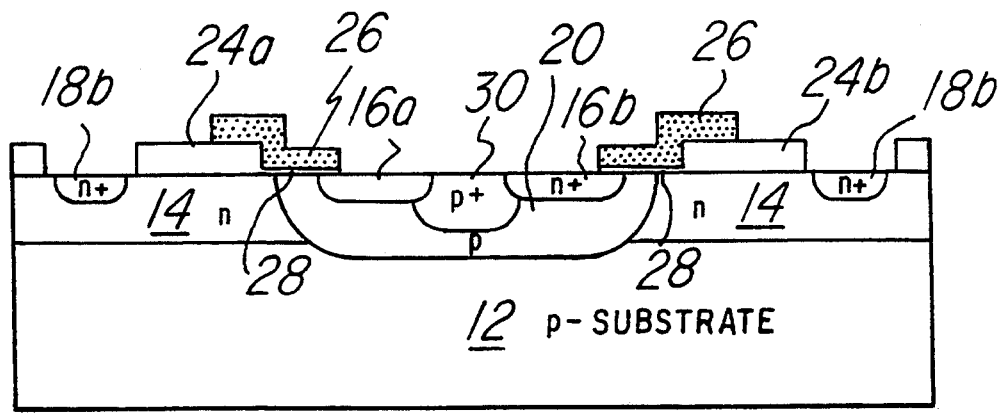

A gate layer is then formed over the device structure. The gate layer is then patterned and etched to form gate electrode 26 as illustrated in FIG. 8. In the preferred embodiment, the gate electrode comprises doped polysilicon (either polycrystalline or amporphus silicon can be used). The preferred method of formation is to deposit, for example, using a chemical vapor deposition process. The polysilicon gate 26 can be doped in situ or can be doped after it is formed. For example, by implantation or diffusion. Alternatively, other conductive materials can be used for the gate. These materials include metals such as aluminum or silicides such as titanium or tungsten silicide.

Finally, a metallization process is used to form the contact regions 32a, 32b and 34 to complete the structure illustrated in FIG. 1. An insulating layer, such as silicon dioxide, is formed over the device. Contact holes are then etched into the insulating layer and conductive contacts and interconnect lines are formed to electrically couple the device 10 to other devices on the integrated circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a DMOS transistor device comprising the steps of:
   providing a semiconductor layer of a first conductivity type;
   forming an insulating layer on said semiconductor layer;
   patterning said insulating layer to expose a source window portion of said semiconductor layer and to expose a drain window portion of said semiconductor layer;
   forming a D-well region by introducing a conductive impurity within said source window portion of said semiconductor layer;
   forming a sidewall region adjacent a sidewall of said insulating layer around said source window;
   forming a source region within said source window portion of said semiconductor layer and forming a drain region within said drain window portion of said semiconductor layer; and
   forming a gate electrode over a portion of said D-well region between said source region and said insulating layer, said gate electrode formed over a channel region within said D-well between said source and drain regions.

2. The method of claim 1 wherein said semiconductor layer of said first conductivity type comprises an n-doped silicon layer.

3. The method of claim 1 wherein said semiconductor layer comprises an n-type layer formed over a p-substrate.

4. The method of claim 1 wherein said insulating layer comprises a field oxide.

5. The method of claim 4 wherein said substrate is silicon and said step of forming the field oxide comprises thermally growing silicon dioxide.

6. The method of claim 1 wherein said step of patterning said insulating layer is performed with a single mask.

7. The method of claim 1 wherein said step of forming a D-well comprises implanting conductive impurities into said semiconductor layer.

8. The method of claim 7 wherein said conductive impurities comprise boron.

9. The method of claim 1 wherein said step of forming a sidewall region further comprises forming a second sidewall region adjacent a sidewall of said insulating layer around said drain window.

10. The method of claim I and further comprising the step of forming a thin insulating layer over said insulating layer and said source and drain windows prior to forming said sidewalls.

11. The method of claim 10 wherein said thin insulating layer comprises a nitride layer and said insulating layer and said sidewall region comprise oxide regions.

12. The method of claim 1 wherein said sidewall region is formed from tetraethoxysilane.

13. The method of claim 1 wherein said step of forming source and drain regions comprise implanting n-type impurities.

14. The method of claim 13 wherein said n-type impurities comprise arsenic or phosphorus ions.

15. The method of claim 1 wherein said gate electrode comprises doped silicon.

16. The method of claim 1 wherein said step of forming a gate electrode comprises depositing silicon.

17. The method of claim 1 wherein said gate electrode is in situ doped.

18. The method of claim 1 and further comprising the steps of forming a source contact over said source region and forming a drain contact over said drain region.

19. The method of claim 1 and further comprising the step of forming a body contact region within said D-well adjacent said source region.

20. A method of forming a lateral DMOS transistor device comprising the steps of:
   providing an n-type silicon layer formed over a p-type substrate;
   forming a field oxide layer over said n-type layer;
   patterning said field oxide layer to expose a source window portion of said semiconductor layer and to expose a drain window portion of said semiconductor layer;
   implanting boron within said source window portion of said n-type layer to form a p-type D-well;
   forming a nitride layer over said field oxide and source and drain windows;
   subsequently forming a sidewall oxide region adjacent a sidewall of said field oxide around said source window;
   subsequently implanting n-type impurities to form a source region within said source window portion of said silicon layer and a drain region within said drain window portion of said silicon layer, said source region formed within said D-well; and
   forming a gate electrode over a portion of said D-well region between said source region and said field oxide, said gate electrode formed over a channel region within said D-well between said source and drain regions.

* * * * *